United States Patent
Sei et al.

(10) Patent No.: US 9,246,090 B2
(45) Date of Patent: *Jan. 26, 2016

(54) STORAGE DEVICE AND STORAGE UNIT

(71) Applicant: Sony Corporation, Tokyo (JP)

(72) Inventors: Hiroaki Sei, Kanagawa (JP); Kazuhiro Ohba, Tokyo (JP); Takeyuki Sone, Kanagawa (JP); Minoru Ikarashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/912,996

(22) Filed: Jun. 7, 2013

(65) Prior Publication Data

US 2013/0334489 A1 Dec. 19, 2013

(30) Foreign Application Priority Data

Jun. 19, 2012 (JP) .................................. 2012-137588

(51) Int. Cl.
| | | |
|---|---|---|
| H01L 45/00 | (2006.01) | |
| H01L 29/86 | (2006.01) | |
| H01L 29/43 | (2006.01) | |
| H01L 29/417 | (2006.01) | |
| H01L 27/24 | (2006.01) | |

(52) U.S. Cl.
CPC ........ H01L 45/1253 (2013.01); H01L 27/2436 (2013.01); H01L 27/2472 (2013.01); H01L 45/08 (2013.01); H01L 45/085 (2013.01); H01L 45/1233 (2013.01); H01L 45/1266 (2013.01); H01L 45/145 (2013.01); H01L 45/146 (2013.01)

(58) Field of Classification Search
None
See application file for complete search history.

(56) References Cited

U.S. PATENT DOCUMENTS

| | | | | |
|---|---|---|---|---|
| 7,560,724 | B2 * | 7/2009 | Aratani et al. | 257/5 |
| 8,085,577 | B2 * | 12/2011 | Kanno et al. | 365/148 |
| 2005/0226036 | A1 * | 10/2005 | Aratani et al. | 365/158 |
| 2008/0083918 | A1 * | 4/2008 | Aratani et al. | 257/5 |
| 2009/0039337 | A1 * | 2/2009 | Ohba et al. | 257/4 |
| 2011/0175049 | A1 * | 7/2011 | Yasuda et al. | 257/3 |
| 2011/0194329 | A1 * | 8/2011 | Ohba et al. | 365/148 |
| 2012/0218808 | A1 * | 8/2012 | Yasuda et al. | 365/148 |

FOREIGN PATENT DOCUMENTS

JP  2006-196537  7/2006

OTHER PUBLICATIONS

Min-Gyu Sung, Sook Joo Kim, Moon Sig Joo, Jae Sung Roh, Cheolhwi Ryu, Seunghun Hong, Heonho Kim, Yong Soo Kim, Effect of the oxygen vacancy gradient in titanium dioxide on the switching direction of bipolar resistive memory, Solid-State Electronics, vol. 63, Issue 1, Sep. 2011, pp. 115-118.*
Menzel, Stephan Jan Martin, "Modeling and Simulation of Resistive Switching Devices", Rheinisch-Westfaischen Technischen Hochschule, 2012, diss.*
Liu, T., et. al. ECS Solid State Letters, 1 (1) Q11-13 (2012).*
"Understanding Volume Resistivity Requirements" downloaded from URL < http://four-point-probes.com/understanding-volume-resistivity-measurements/ > on Nov. 10, 2014.*
Waser, et al., "Redox-Based Resistive Switching Memories—Nanoionic Mechanisms, Prospects, and Challenges", Advanced Materials, vol. 27, pp. 2632-2663, dated 2009.

* cited by examiner

*Primary Examiner* — Joseph Schoenholtz
(74) *Attorney, Agent, or Firm* — Sony Corporation

(57) ABSTRACT

A storage device includes: a first electrode; a storage layer including an ion source layer; and a second electrode. The first electrode, the storage layer, and the second electrode are provided in this order. The ion source layer contains a movable element, and has a volume resistivity of about 150 mΩ·cm to about 12000 mΩ·cm both inclusive.

13 Claims, 8 Drawing Sheets

STORAGE DEVICE AND STORAGE UNIT

BACKGROUND

The present disclosure relates to a storage device and a storage unit that store information by change in electrical characteristics of a storage layer that includes an ion source layer.

As semiconductor non-volatile memories for data storage, NOR-type or NAND-type flash memories have been generally used. Although a memory device and a driving transistor have been miniaturized in order to increase the capacity of a semiconductor non-volatile memory, the limitation in miniaturization has been pointed out since a high-voltage is necessary for writing and erasing and the number of electrons to be injected into the floating gate is limited.

Currently, resistance change memories such as a ReRAM (resistance random access memory) and a PRAM (phase-change random access memory) have been proposed as next generation non-volatile memories capable of breaking through the limitation in miniaturization (for example, see Japanese Unexamined Patent Application Publication No. 2006-196537 and Waser et al., Advanced Material, 21, p. 2932 (2009)). Such memories have a simple structure in which a resistance change layer is disposed between two electrodes, and it is considered that atoms or ions transfer due to heat or an electric field to form a conduction path, and thus the resistance value of the resistance change layer is changed, thereby performing writing and erasing.

A multi-value of a memory is an alternative way to increase the capacity of the memory in which writing and erasing are performed using the resistance change besides the miniaturization of the memory as described above. Allowing the multi-value of the memory, in other words, allowing a multi-value recording of 2 bits (4 values), 3 bits (8 values) etc. per device increases the capacity two-fold, three-fold, and so on.

SUMMARY

To achieve the multi-value recording, it is necessary to perform writing of a plurality of conductance values. However, a memory includes a plurality of storage devices, and it is difficult to control and uniformize writing conductance values of all devices under respective writing conditions, and therefore there is an issue that a variation in conductance value between devices is easily caused.

It is desirable to provide a storage device and a storage unit that reduce a variation in conductance value between a plurality of devices.

A storage device according to an embodiment of the present technology includes: a first electrode; a storage layer including an ion source layer; and a second electrode. The first electrode, the storage layer, and the second electrode are provided in this order. The ion source layer contains a movable element, and has a volume resistivity of about 150 mΩ·cm to about 12000 mΩ·cm both inclusive.

In the storage device according to the above-described embodiment of the present technology, when a voltage pulse or current pulse is applied to a device at an initial state (high resistance state) in a "positive direction" (for example, a negative potential on the first electrode side and a positive potential on the second electrode side), the metallic element in the ion source layer may be ionized and diffused into the storage layer (for example, into the resistance change layer), or oxygen ions may transfer to generate an oxygen defect in the resistance change layer. Consequently, a low-resistance section (conduction path) in a low oxidation state may be formed in the storage layer, and a resistance of the resistance change layer is decreased (record state). When a voltage pulse is applied to a device in the low-resistance state in a "negative direction" (for example, a positive potential on the first electrode side and a negative potential on the second electrode side), metal ions in the resistance change layer may transfer into the ion source layer, or the oxygen ions may transfer from the ion source layer, and the oxygen defect at the conduction path portion is decreased. Consequently, the conduction path including metallic element disappears, and a state where the resistance change layer has a high resistance (initial state or erase state) is established.

Here, the ion source layer contains the movable element and has the volume resistivity of about 150 mΩ·cm to about 12000 mΩ·cm both inclusive. Hence, controllability of a writing conductance value under a predetermined writing condition is improved.

A storage unit according to an embodiment of the present technology is provided with a plurality of storage devices and a pulse applier that selectively applies one of a voltage pulse and a current pulse to the storage devices. The storage devices each include: a first electrode; a storage layer including an ion source layer; and a second electrode. The first electrode, the storage layer, and the second electrode are provided in this order. The ion source layer contains a movable element, and has a volume resistivity of about 150 mΩ·cm to about 12000 mΩ·cm both inclusive.

According to the storage device and the storage unit of the above-described embodiments of the present technology, the ion source layer contains the movable element, and has the volume resistivity of about 150 mΩ·cm to about 12000 mΩ·cm both inclusive. Therefore, controllability of a conductance value under a predetermined writing condition is improved, and it is possible to reduce a variation in writing conductance value between a plurality of devices.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, an embodiment of the present disclosure is described in the following order with reference to the drawings.
1. Embodiment
1-1. Storage Device
1-2. Storage Unit
2. Working Example 1. Embodiment (1-1. Storage Device)

Figure 1:
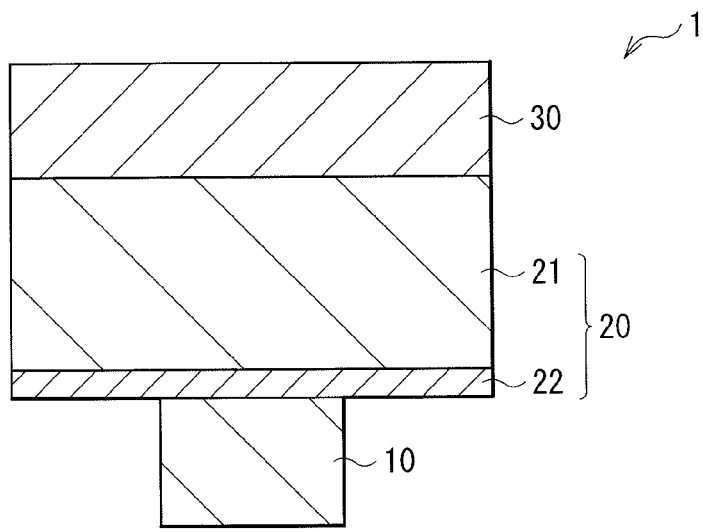
FIG. 1 is a sectional view showing a configuration of a storage device according to an embodiment of the present disclosure.

FIG. 1 shows a cross-sectional configuration of a storage device 1 according to an embodiment of the present disclosure. The storage device 1 includes a lower electrode 10 (first electrode), a storage layer 20 that includes an ion source layer 21, and an upper electrode 30 (second electrode) in this order.

The lower electrode 10 may be provided on a substrate 41, which may be made of silicon and may be formed with a CMOS (complementary metal oxide semiconductor) circuit, and may serve as a connecting section for connection to the CMOS circuit as described later (FIG. 4), for example. The lower electrode 10 may be made of a wiring material for use in semiconductor processes. Examples of the wiring material may include tungsten (W), tungsten nitride (WN), copper (Cu), aluminum (Al), molybdenum (Mo), tantalum (Ta), and silicide. When the lower electrode 10 is made of a material such as Cu which may cause ion conduction by an electric field, a surface of the lower electrode 10 made of Cu or the like may be covered with a material less likely to cause ion conduction, heat diffusion, or the like, such as W, WN, titanium nitride (TiN), or tantalum nitride (TaN).

The storage layer 20 has a structure in which the ion source layer 21 and a resistance change layer 22 are laminated in order from the upper electrode 30 side. The ion source layer 21 includes an element (movable element) that forms a conduction path in the resistance change layer 22.

In the present embodiment, the ion source layer 21 includes the movable element as described above, and is provided in contact with the upper electrode 30. The movable element is positively ionized or negatively ionized by application of an electric field and transfers into the resistance change layer 22, thereby forming the conduction path. Examples of the movable element to be positively ionized may include transition metal elements, in particular, metallic elements belonging to Group 4 elements (titanium (Ti), zirconium (Zr), and hafnium (Hf)), Group 5 elements (vanadium (V), niobium (Nb), and tantalum (Ta)), and Group 6 elements (chromium (Cr), molybdenum (Mo), and tungsten (W)) in the Periodic Table. Examples of the movable element to be negatively ionized may include Group 16 elements, in particular, chalcogen elements such as tellurium (Te), sulfur (S), and selenium (Se) in the Periodic Table. In addition, oxygen (O) may also be used. It is to be noted that, in the present embodiment, the ion source layer 21 contains one or two or more of such movable elements.

Preferably, the ion source layer 21 of the present embodiment may have a volume resistivity of about 150 mΩ·cm to about 12000 mΩ·cm both inclusive. In the storage device 1 which performs writing and erasing with use of a resistance change as in the present embodiment, the volume resistivity of the ion source layer 21 greatly influences controllability of an intermediate resistance value, or in other words a predetermined writing conductance value, which is important for achieving multi-value recording.

In the ion source layer 21, the above-mentioned transition metal element, the chalcogen element, and oxygen combine with each other and form a metal chalcogenide oxide layer. The metal chalcogenide oxide layer mainly has an amorphous structure, and serves as an ion supply source. The conduction path including the above-mentioned transition metal element is chemically stable as compared with other transition metal elements in the proximity of the ion source layer 21 and in the resistance change layer 22, and easily causes an intermediate oxidation state and maintains the intermediate oxidation state easily as well.

In addition, at or near the conduction path formed of the transition metal element, three states of "metal state/chalcogen compound state/oxide state" whose resistance values are "low/intermediate/high", respectively, are obtained. The resistance value of the resistance change layer 22 is determined by a mixture state of the three states, and it is possible to obtain various values (intermediate resistance values) by varying the mixture state of the three states.

Figure 2:
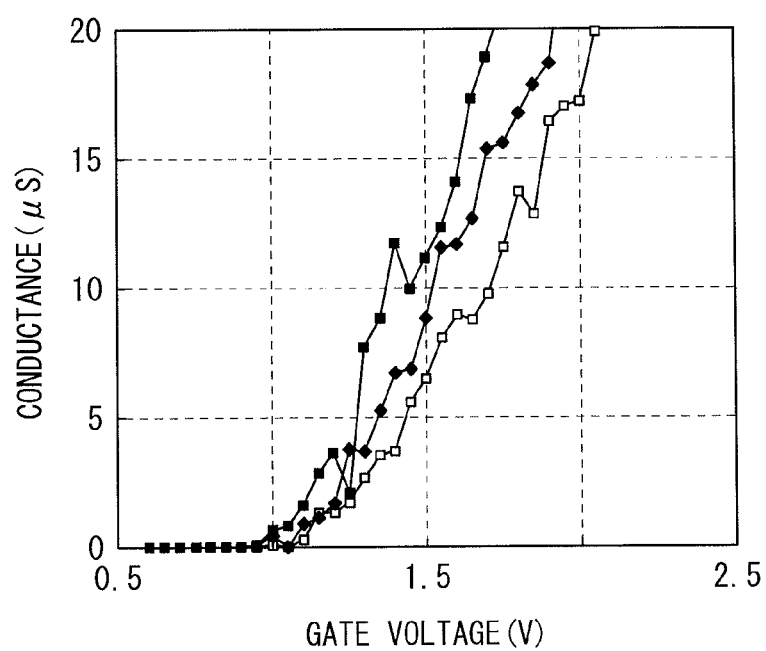
FIG. 2 is a characteristic diagram illustrating a variation in conductance value in an existing example.

It should be noted that, in a storage device that performs writing and erasing with use of the resistance change, it is difficult to control a conductance value corresponding to a writing condition for obtaining an intermediate resistance value. FIG. 2 shows a variation in writing conductance value (hereinafter simply referred to as conductance value) when gate voltages (Vgw) of 0.6 V to 2.05 V are applied to existing resistance-change-type storage devices (in this example, three devices). It is seen from FIG. 2 that a variation in conductance value relative to the gate voltages differs from device to device. Therefore, it is difficult to achieve a multi-value of a storage unit that includes a plurality of storage devices.

Figure 3:
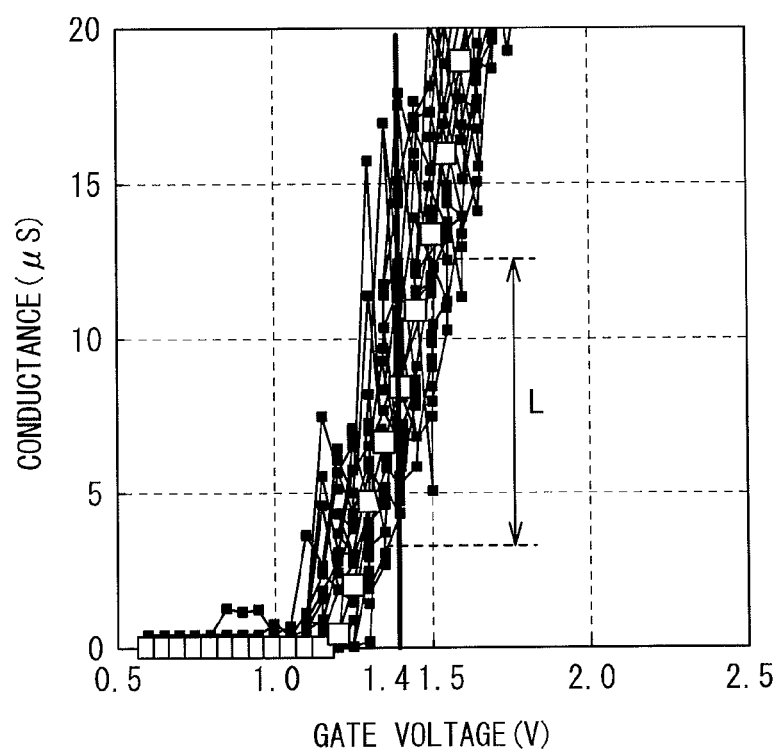
FIG. 3 is a characteristic diagram illustrating measured values and average values of the conductance values in the existing example.

FIG. 3 is a plot showing, in an overlapped manner, conductance values of the case where the gate voltages (Vgw) of 0.6 V to 2.05 V are applied to 30 storage devices (30 bits) similarly to FIG. 2 (indicated by black square ■), and showing average values of the conductance values (average conductance values) at the respective gate voltages (indicated by white square □). To achieve a multi-value of a storage unit, it is necessary to control the conductance value under a predetermined writing condition (predetermined gate voltage). Specifically, first, it is preferable that the conductance value gradually vary relative to the gate voltages. This is because it is difficult to finely control the conductance values of multiple bits necessary for achieving the multi-value in the storage device in which the conductance value abruptly varies in response to a slight variation in gate voltage as can be seen from FIG. 3. Second, it is preferable that the variation in conductance value between the devices at each gate voltage be small. For example, it can be said that, as illustrated in FIG. 3, it is necessary for a width (L) of the conductance values at the gate voltage 1.4 V to be decreased.

Although details will be described in a working example, the controllability of the conductance value and the variation in conductance value between the devices are improved by adjusting the volume resistivity of the ion source layer 21 to be in a range from about 150 mΩ·cm to about 12000 mΩ·cm both inclusive as described above. It is to be noted that, when the volume resistivity of the ion source layer 21 is lower than about 150 mΩ·cm, the variation in conductance value is great when writing is performed under the same condition. When the volume resistivity is greater than about 12000 mΩ·cm, a current or a voltage necessary for writing is excessively increased, and thus writing is inhibited.

More preferably, for a film thickness (for example, about 10 nm to about 15 nm both inclusive) of the ion source layer 21 used in the miniaturized storage device 1, the volume resistivity may be about 450 mΩ·cm to about 3000 mΩ·cm both inclusive. When an initial resistance value of the ion source layer 21 is small, an operating current of the storage device 1 may be increased. The initial resistance value of the ion source layer 21 is proportional to the product of the volume resistivity and the film thickness of the ion source layer 21. That is, when the volume resistivity is decreased, it is necessary to increase the film thickness in order to obtain the same resistance value. In view of this, when the film thickness of the ion source layer 21 is set to the film thickness mentioned above (about 10 nm to about 15 nm both inclusive, for example), the resistivity may be set to about 450 mΩ·cm or more to allow the operating current to have a proper value. In addition, since the voltage necessary for writing is increased when the resistance value of the ion source layer 21 is great, the volume resistivity of the ion source layer 21 may be preferably about 3000 mΩ·cm or lower.

It is to be noted that, as long as an effect of an embodiment of the technology is not impaired, the ion source layer 21 may contain elements other than those mentioned above, such as manganese (Mn), cobalt (Co), iron (Fe), nickel (Ni), platinum (Pt), and Si, for example. Preferably, the ion source layer 21 may not contain aluminum (Al) and copper (Cu). As described above, in order to achieve the multi-value recording, it is preferable that the variation in conductance value between the devices at each gate voltage be small, and that the variation in conductance value relative to the gate voltage be gradual. For these reasons, preferably, the ion source layer 21 may be made of an element which is difficult to be transferred by application of an electric field (application of a gate voltage). However, the above-mentioned Al and Cu are high in mobility at the time of voltage application and therefore are likely to transfer in the above-described metal chalcogenide, which makes it easier to vary the conductance value consequently.

The resistance change layer 22 may contain at least any one of a metal oxide, a metal nitride, and a metal oxynitride. In this embodiment, the resistance change layer 22 may be provided in contact with the lower electrode 10. The resistance change layer 22 may have a resistance value which is varied when a predetermined voltage is applied between the lower electrode 10 and the upper electrode 30. A metal material of the resistance change layer 22 is not specifically limited as long as the resistance change layer 22 has a high resistance of several MΩ to several hundred GΩ at an initial state, for example. For example, when a metal oxide is used as a material of the resistance change layer 22, desirably, metallic elements such as Zr, Hf, Al, and rare-earth elements which allow formation of metal oxides having high resistance, that is, a large band gap may be used. Also, when a metal nitride is used as a material of the resistance change layer 22, desirably, metallic elements such as Zr, Hf, Al, and rare-earth elements may be used, since such elements achieve a resistance value of several MΩ to several hundred GΩ and are likely to have a high resistivity at the time of an erase operation in which the conduction path is oxidized by transfer of oxygen. Likewise, when a metal oxynitride is used as a material of the resistance change layer 22, the metallic elements which achieve the resistance value of several MΩ to several hundred GΩ may be used. While a film thickness of the resistance change layer 22 is not specifically limited as long as the above-described device resistance of several MΩ to several hundred GΩ is achieved and while an optimal value varies depending on a size of a device and the resistance value of the ion source layer 21, the film thickness of the resistance change layer 22 may be preferably about 1 nm to about 10 nm both inclusive, for example.

It is to be noted that the formation of the resistance change layer 22 is optional. In a manufacturing process of the storage device 1, the transition metal element and oxygen contained in the ion source layer 21 are combined with each other, and a metal oxide film corresponding to the resistance change layer 22 is formed naturally on the lower electrode 10. Otherwise, an oxide film formed by application of a voltage bias in an erase direction may be an equivalent of the resistance change layer 22.

Similarly to the lower electrode 10, while existing semiconductor wiring materials may be used to form the upper electrode 30, preferably, a stable material that does not react with the ion source layer 21 even when subjected to post annealing may be used.

In the storage device 1 according to the present embodiment, when a voltage pulse or a current pulse is applied through the lower electrode 10 and the upper electrode 30 from a power source circuit 60 (pulse applier), electrical characteristics (resistance value) of the storage layer 20 is varied, and thus writing, erasing, and further reading out of information are performed. Such an operation is specifically described below.

First, a positive voltage may be applied to the storage device 1 having a high-resistive initial state so that the upper electrode 30 side may have a positive potential and the lower electrode 10 side may have a negative potential, for example. Consequently, the transition metal element in the ion source layer 21 is ionized and transferred to the lower electrode 10 side, or a cathode reaction on the lower electrode 10 side is caused by oxygen ions transferred from the lower electrode 10 side, whereby reduction reaction is caused at the resistance change layer 22 formed on an interface of the lower electrode 10. This generates portions where oxygen defect concentration is increased. When the portions having the high oxygen defect concentration, or the portions having a low oxidation state, are connected to each other, a conduction path is formed in the resistance change layer 22, and the resistance value of the resistance change layer 22 becomes lower (low-resistance state) than the resistance value (high resistance state) at the initial state.

Thereafter, even when the positive voltage is removed and the voltage application is stopped for the storage device 1, the low-resistance state is maintained. Thus, information is written. When the storage device 1 is used in a storage unit such as a so-called PROM (programmable read only memory) that allows writing only once, recording is completed with only the above-mentioned recording step.

On the other hand, an erasing step is necessary when the storage device 1 is used in storage units such as a RAM (random access memory) and an EEPROM (electronically erasable and programmable read only memory) that allow erasing. In the erasing step, a negative voltage may be applied to the storage device 1 so that the upper electrode 30 side may have a negative potential and the lower electrode 10 side may have a positive potential, for example. Consequently, an anode reaction is caused at the conduction path of the portions having the high oxygen defect concentration, or the portions having the low oxidation state, which configure the conduction path formed in the resistance change layer 22, whereby transition metal ions are oxidized and transferred to the ion source layer 21 side. Otherwise, oxygen ions are transferred from the ion source layer 21 to the proximity of the conduction path of the resistance change layer 22, and thus the oxygen defect concentration is decreased or the oxidation state is increased at the conduction path. Consequently, the conduction path is disconnected, and the resistance value of the resistance change layer 22 is changed from the low-resistance state to the high resistance state.

Thereafter, even when the negative voltage is removed and the voltage application is stopped at the storage device 1, the high resistance value is maintained. Thus, the information written therein is erased. By repeating the above-mentioned steps, it is possible to repeatedly perform writing of information to the storage device 1 and erasing of the information written in the storage device 1.

In the above-mentioned storage device 1, for example, when a state where the resistance value is high corresponds to information "0" and a state where the resistance value is low corresponds to information "1", it is possible to change "0" to "1" in the step of recording information by application of a positive voltage, and to change "1" to "0" in the step of erasing information by application of a negative voltage. It is to be noted that, in this instance, the operation that lowers the resistance of the storage device and the operation that increases the resistance of the storage device correspond to the writing operation and the erase operation, respectively, but this relationship may be reversed.

In the present embodiment, controlling a voltage at the time of application of a bias voltage to the lower electrode 10 side, controlling a limiting resistor or a gate voltage of a drive MOS transistor, or the like in a writing operation allows control of the so-called "writing resistance" and adjustment of the intermediate resistance value (writing conductance value). In addition, in the erasing operation, adjusting a magnitude of the bias voltage, the limiting resistor, a current value with use of the gate voltage of the MOS transistor, or the like allows control of the intermediate resistance value. Thus, not only two but also multi-valued memory is achieved.

For example, intermediate resistance values between the above-mentioned two resistance values of "0" and "1" may be adjusted to add, for example, two levels, and the respective levels may be defined as "00", "01", "10", and "11". In this case, it is possible to perform recording of four values. That is, it is possible to record 2-bit information per device.

In the storage device 1 of the present embodiment, the volume resistivity of the ion source layer 21 is set to fall in a range from about 150 mΩ·cm to about 12000 mΩ·cm both inclusive as described above, making it possible to improve the controllability of the conductance value and the variation in conductance value between the devices.

A method of manufacturing the storage device 1 of the present embodiment is described below.

First, the lower electrode 10 which may be made of TiN, for example, is formed on a substrate on which a CMOS circuit such as a select transistor is formed. Then, if necessary, reverse sputtering or the like may be performed to remove oxide etc., on the surface of the lower electrode 10. Subsequently, the resistance change layer 22, the ion source layer 21, and the upper electrode 30 are sequentially formed in a sputtering apparatus with use of targets having compositions appropriate for the materials of the respective layers while replacing the targets. An electrode diameter may be about 50 nm ϕ to about 300 nm ϕ both inclusive. An alloy film may be formed together with use of targets of respective constituent elements.

After the films up to the upper electrode 30 are formed, a wiring layer (not illustrated) to be connected to the upper electrode 30 is formed, and all of the storage devices 1 and a contact section configured to obtain a common potential are connected to each other. Thereafter, post annealing is performed on the laminated film. Thus, the storage device 1 illustrated in FIG. 1 is completed.

In the storage device 1, as described above, a voltage may be applied in such a manner that the upper electrode 30 and the lower electrode 10 have a positive potential and a negative potential, respectively, whereby the conduction path is formed in the resistance change layer 22. Consequently, the resistance value of resistance change layer 22 is decreased, and writing is performed. Next, a voltage having a polarity opposite to that in the writing is applied to each of the upper electrode 30 and the lower electrode 10, whereby the metallic element in the conduction path formed in the resistance change layer 22 is ionized and transferred to the ion source layer 21. Otherwise, the oxygen ions transfer from the ion source layer 21 to the resistance change layer 22, in particular, to the conduction path of the resistance change layer 22. Consequently, the oxygen defect concentration is decreased or the oxidation state is increased, and thus the conduction path is disconnected. As a result, the resistance value of the resistance change layer 22 is increased, and thus erasing is performed. Further, the voltages to be applied at the time of writing and erasing are adjusted to control the intermediate resistance value, and thus the multi-value recording is achieved.

For example, in existing miniaturized storage devices, a storage device has been reported that has a "lower electrode/ storage layer/upper electrode" configuration and in which an RRAM material containing oxygen and a transition metal element is used for a storage layer. In miniaturized storage devices, since a driving current of a transistor is decreased and a driving current for writing is decreased, a resistance value in a low-resistance state is even further increased, and an interval of resistance value (resistance interval) between the low-resistance state and the high resistance state is narrowed. In order to achieve the multi-value recording in memories that perform writing and erasing with use of the resistance change as described above, it is necessary to control an intermediate resistance value (conductance value) between the low-resistance and the high resistance. Specifically, in order to achieve the multi-value operation, it is necessary to divide the narrow resistance interval into four levels (2 bit/cell), eight levels (3 bit/cell), or the like, and to control the conductance values that correspond to the resistance values, for example.

However, a storage unit is configured of a plurality of storage devices, and there is an issue in existing storage devices that the conductance values at respective gate voltages differ between the devices as illustrated in FIG. 2. In addition, as illustrated in FIG. 3, upon application of an electric field, specifically, upon application of a voltage between electrodes that are opposed to each other with a storage layer therebetween, the conductance value is greatly varied with only a slight variation in applied voltage when the voltage applied thereto (for example, gate voltage) is greater than 1.1 V. Such a great variation in conductance value in response to the application of low voltage has made a control of an intermediate resistance value of a storage device difficult. In particular, there is an issue that, in a miniaturized storage device whose resistance interval between the low-resistance state and the high resistance state is narrow, a fine control of resistance value is difficult. Under such circumstances, it has been difficult to achieve the multi-value in a storage unit that includes the existing storage devices.

In contrast, in the storage device 1 according to the present embodiment, the movable element is used for the material of the ion source layer 21 configuring the storage layer 20, and the volume resistivity of the ion source layer 21 is in a range from about 150 mΩ·cm to about 12000 mΩ·cm both inclusive. Consequently, the variation in conductance value in response to each applied voltage is decreased, and thus the controllability of conductance value is improved.

Therefore, in the storage device 1 according to the present embodiment, the ion source layer 21 contains the movable element and has the volume resistivity of about 150 mΩ·cm to about 12000 mΩ·cm both inclusive. Thus, the variation in conductance value caused by the variation in applied voltage is decreased. Consequently, the controllability of the conductance value of the storage device 1 is improved, and the variation in conductance value between the plurality of devices is suppressed. As a result, it is possible to provide a storage unit that allows multi-value recording.

(1-2. Storage Unit)

The plurality of storage devices 1 described above may be disposed, for example, in column or in matrix to configure a storage unit (memory). If necessary, each of the storage devices 1 may be connected to a diode or a MOS transistor for device selection to configure a memory cell, and further, may be connected to a sense amplifier, an address decoder, a writing circuit, an erasing circuit, a reading out circuit, etc., through wiring lines.

Figure 4:
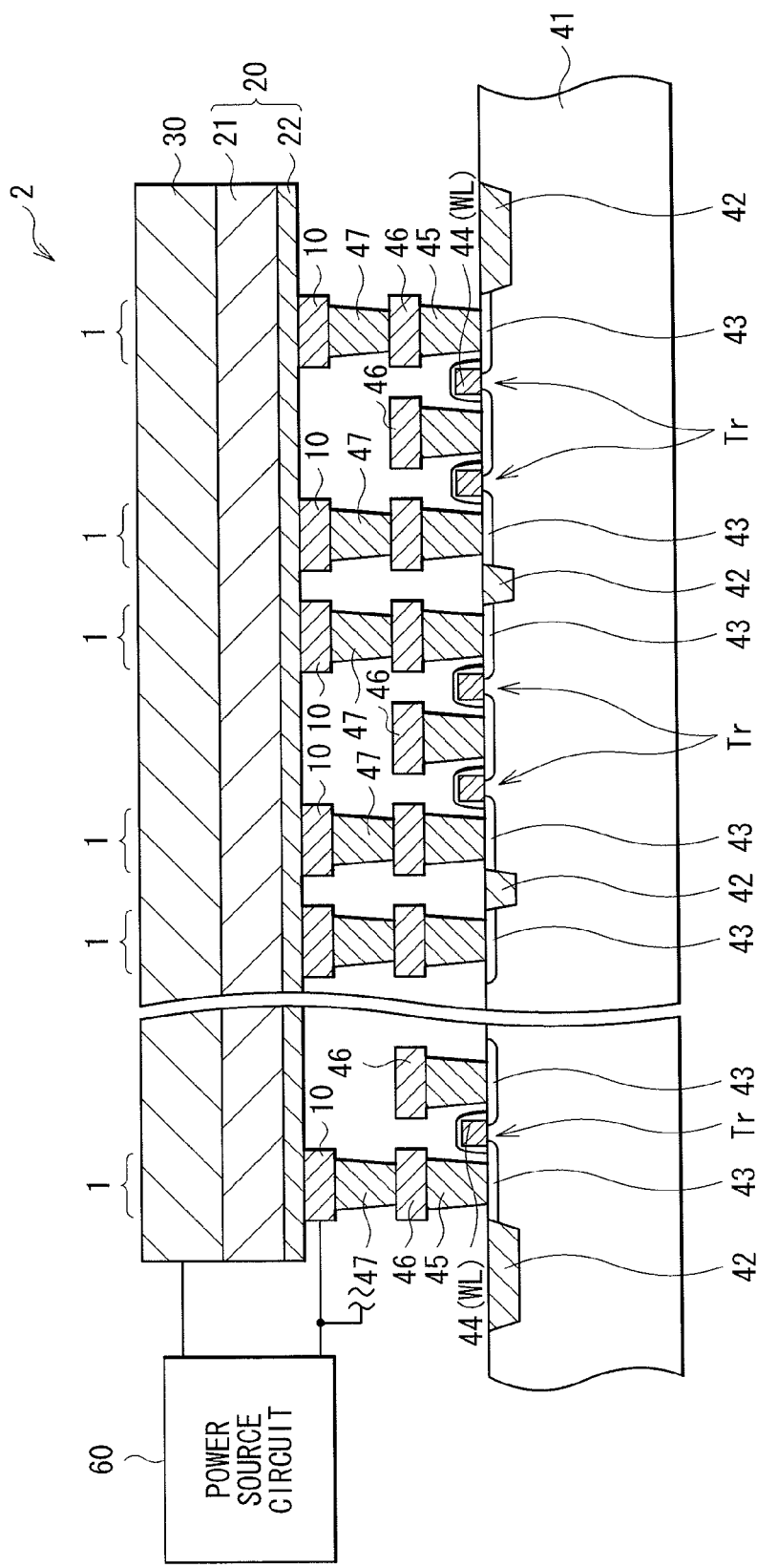
FIG. 4 is a sectional view showing a configuration of a memory cell array using the storage device of FIG. 1.
Figure 5:
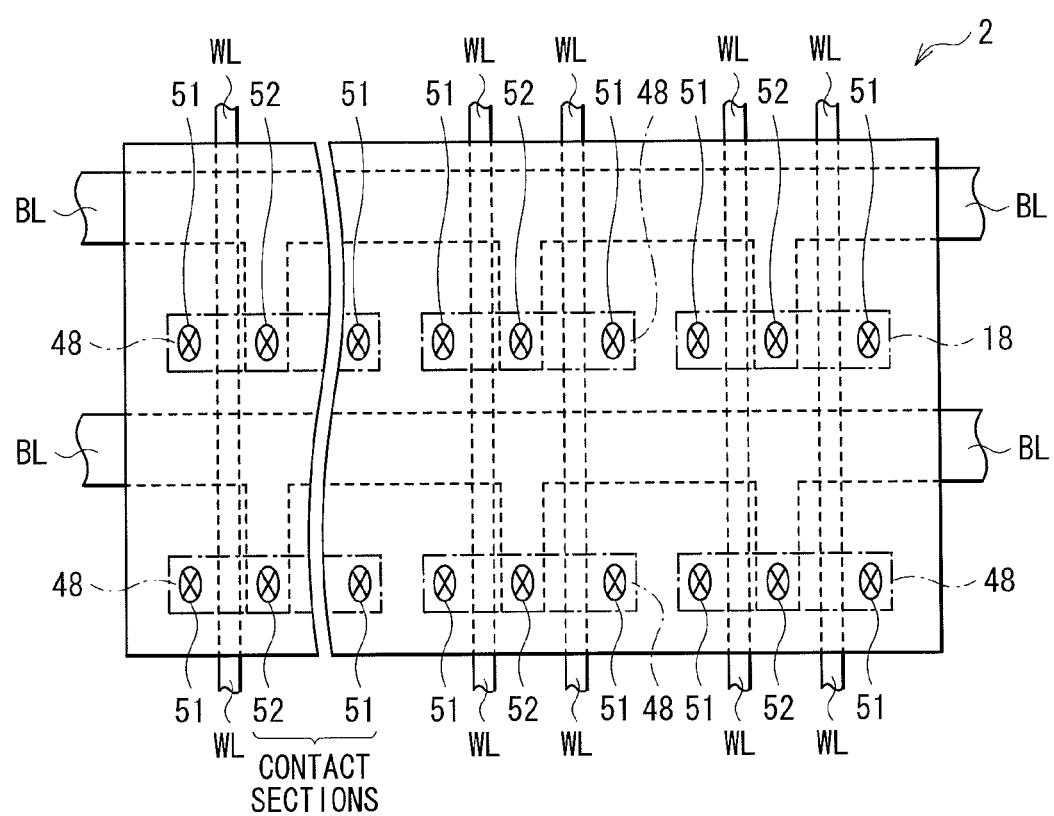
FIG. 5 is a plan view of the memory cell array illustrated in FIG. 4.

FIG. 4 and FIG. 5 each show an exemplary storage unit (memory cell array) in which the plurality of the storage devices 1 are disposed in matrix, wherein FIG. 4 shows a cross-sectional configuration thereof and FIG. 5 shows a planar configuration thereof. In the memory cell array, a wiring line connected to the lower electrode 10 side and a wiring line connected to the upper electrode 30 side are provided to cross each other in each of the storage devices 1, and the storage devices 1 are disposed in the proximity of respective intersections of the wiring lines, for example.

Each of the storage devices 1 shares the resistance change layer 22, the ion source layer 21, and the upper electrode 30. That is, the resistance change layer 22, the ion source layer 21, and the upper electrode 30 are each configured of a layer (same layer) common to the storage devices 1. The upper electrode 30 serves as a plate electrode PL common to adjacent cells.

On the other hand, the lower electrode 10 is separately provided for each of the memory cells and is thus electrically separated from each other between adjacent cells. Thus, the storage devices 1 of the memory cell are defined at respective positions corresponding to the lower electrodes 10. The lower electrodes 10 are connected to respective MOS transistors Tr for cell selection, and the storage devices 1 are provided above the MOS transistors Tr.

Each of the MOS transistors Tr includes a source-drain region 43 and a gate electrode 44 that are formed in a region separated by device separation layers 42 in the substrate 41. A side wall insulation layer is formed on a wall face of the gate electrode 44. The gate electrode 44 serves also as a word line WL that is one of address wiring lines of the storage device 1. One of a source region and a drain region of the source-drain region 43 of the MOS transistor Tr is electrically connected to the lower electrode 10 of the storage device 1 through a plug layer 45, a metal wiring layer 46, and a plug layer 47. The other of the source region and the drain region of the source-drain region 43 of the MOS transistor Tr is connected to the metal wiring layer 46 through the plug layer 45. The metal wiring layer 46 is connected to a bit line BL that is the other of the address wiring lines of the storage device 1 (see FIG. 5). It is to be noted that, in FIG. 5, active regions 48 of the MOS transistor Tr are denoted by dashed lines, and a contact section 51 is connected to the lower electrode 10 of the storage device 1 and a contact section 52 is connected to the bit line BL.

In the memory cell array, when a gate of the MOS transistor Tr is placed into an on state by the word line WL to apply a voltage to the bit line BL, the voltage is applied to the lower electrode 10 of a selected memory cell through the source and drain of the MOS transistor Tr. Here, when a polarity of the voltage applied to the lower electrode 10 is negative relative to a potential of the upper electrode 30 (plate electrode PL), the resistance value of the storage device 1 becomes a low-resistance state as described above. Thus, information is written to the selected memory cell. Next, when a voltage which is positive in potential relative to the potential of the upper electrode 30 (plate electrode PL) is applied to the lower electrode 10, the resistance value of the storage device 1 again becomes a high-resistance state. Consequently, the information written in the selected memory cell is erased. To read out the written information, a memory cell may be selected by the MOS transistor Tr, and a predetermined voltage or current may be applied to the selected cell, for example. A current or a voltage that differs depending on the resistance state of the storage device 1 at this time may be detected through a sense amplifier or the like connected via the bit line BL or plate electrode PL. It is to be noted that the voltage or the current applied to the selected memory cell is made smaller than a threshold level of a voltage or the like at which the state of the resistance value of the storage device 1 changes.

The storage unit according to the present embodiment is applicable to various kinds of memory units as described above. For example, the storage unit according to the present embodiment is applicable to any memory such as PROM that allows writing only once, EEPROM that allows electrical erasing, or RAM and the like that allow high-speed writing, erasing, and reproducing.

2. Working Example

Specific working examples of an embodiment of the present disclosure are described below.

(Experiments)

The method of manufacturing the storage device 1 described above was used to fabricate samples (Experiments 1-1 to 1-6). First, after the lower electrode 10 made of TiN and including a transistor incorporated in a foundation was cleaned by reverse sputtering, Al having a thickness of 2 nm was formed and oxidized by oxygen plasma to form AlOx, so as to form the resistance change layer 22. Next, for the ion source layer 21, reactive sputtering was performed using Zr60Te40 (atom % ratio) in Ar process gas mixed with oxygen at a flow ratio of, for example, argon (Ar) (sccm)/oxygen (sccm)=75/5. In this manner, a Zr60Te40-Ox film having volume resistivity (mΩ·cm) of 17.8 and a film thickness of 45 nm was formed. Subsequently, W having a thickness of 30 nm was formed to form the upper electrode 30. Finally, heat treatment was performed for 2 hours at 320 degrees Centigrade and then patterning was performed to fabricate each storage device 1 (Experiments 1-1 to 1-6). It is to be noted that the volume resistivity was obtained by the following method. First, in advance, the ion source layer 21 was formed by the above-mentioned method on a silicon wafer having an oxide film, which was then taken out in the atmosphere. Next, probes were directly applied to the ion source layer 21 to measure a resistance value by the four-point probe method. Then, a value thus measured and a value of a thickness of the ion source layer 21 measured by a step gauge were used to obtain the volume resistivity. The compositions of the Experiments 1-1 to 1-6 are described below in the order of "lower electrode/resistance change layer/ion source layer/upper electrode".

Figure 6:
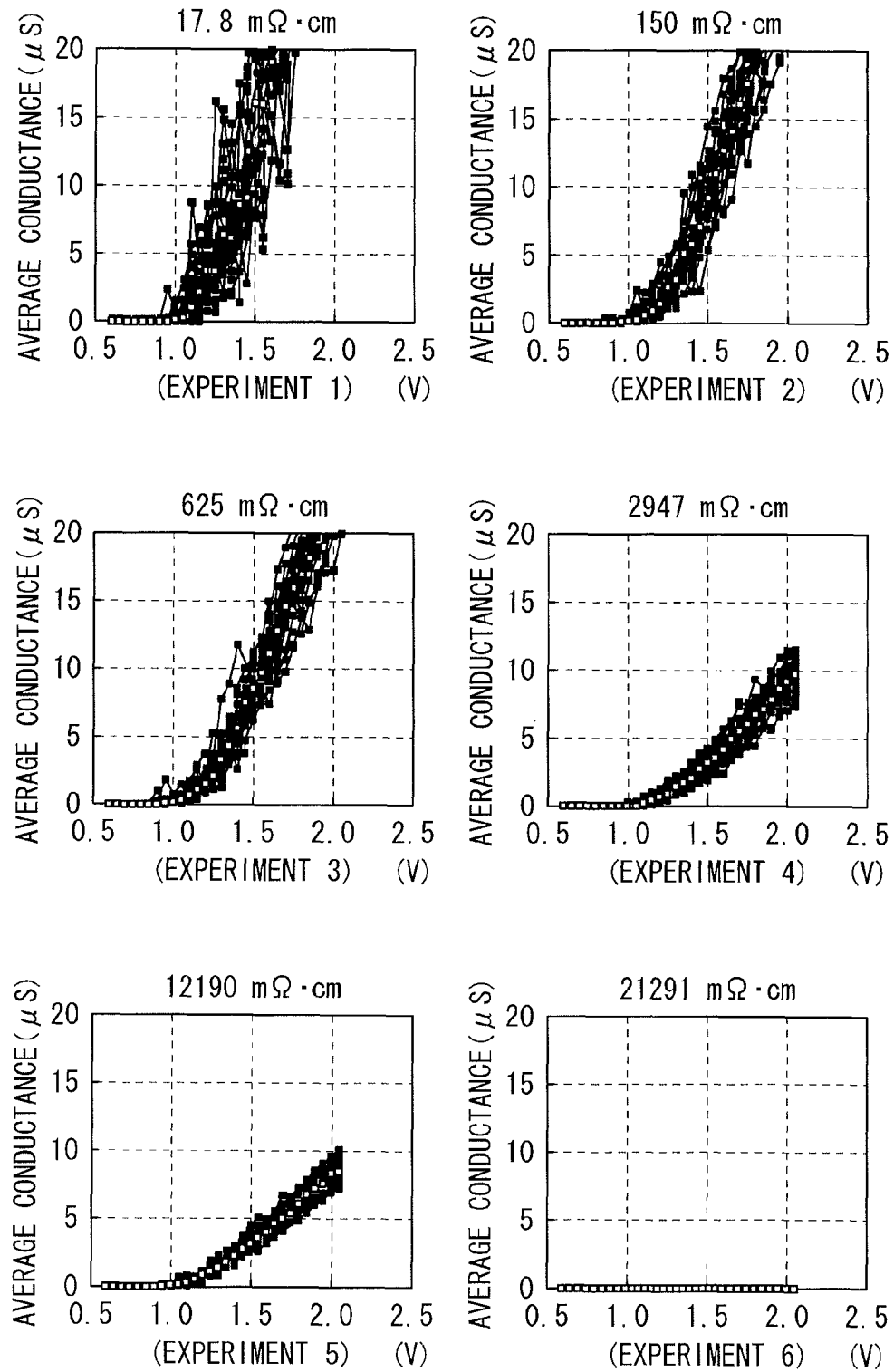
FIG. 6 shows characteristic diagrams of measured values and average values of conductance values of respective experiments according to an embodiment of the present disclosure (Experiments 1-1 to 1-6).

(Experiment 1-1) TiN/Al (2 nm) -Ox/Zr60Te40-Ox (45 nm, 75/5)/W (30 nm); 17.8 mΩ·cm
(Experiment 1-2) TiN/Al (2 nm) -Ox/Zr50Te50-Ox (45 nm, 75/5)/W (30 nm); 150 mΩ·cm
(Experiment 1-3) TiN/Al (2 nm) -Ox/Zr46Te54-Ox (45 nm, 75/5)/W (30 nm); 625 mΩ·cm
(Experiment 1-4) TiN/Al (2 nm) -Ox/Zr50Te50-Ox (45 nm, 75/7)/W (30 nm); 2947 mΩ·cm
(Experiment 1-5) TiN/Al (2 nm) -Ox/Zr40Te60-Ox (45 nm, 75/5)/W (30 nm); 12190 mΩ·cm
(Experiment 1-6) TiN/Al (2 nm) -Ox/Zr30T70-Ox (45 nm, 75/3)/W (30 nm); 21291 mΩ·cm The 30-bit memory arrays 2 which are configured of the above-mentioned respective samples (Experiments 1-1 to 1-6) were fabricated, and writing operation was performed. Specifically, the writing voltage was set to 3.5 V, and the gate voltage was increased by 0.05 V at a time from 0.6 V to 2.05 V to measure the variation in conductance value relative to the gate voltages in the case of 30 bits. Results are illustrated in FIG. 6. In addition, an average value of the conduction values in each of the Experiments 1-1 to 1-6 was obtained (indicated by white square □), and a variation in average conductance value depending on the difference in volume resistivity (Experiments 1-1 to 1-6) is illustrated in FIG. 7.

Figure 7:
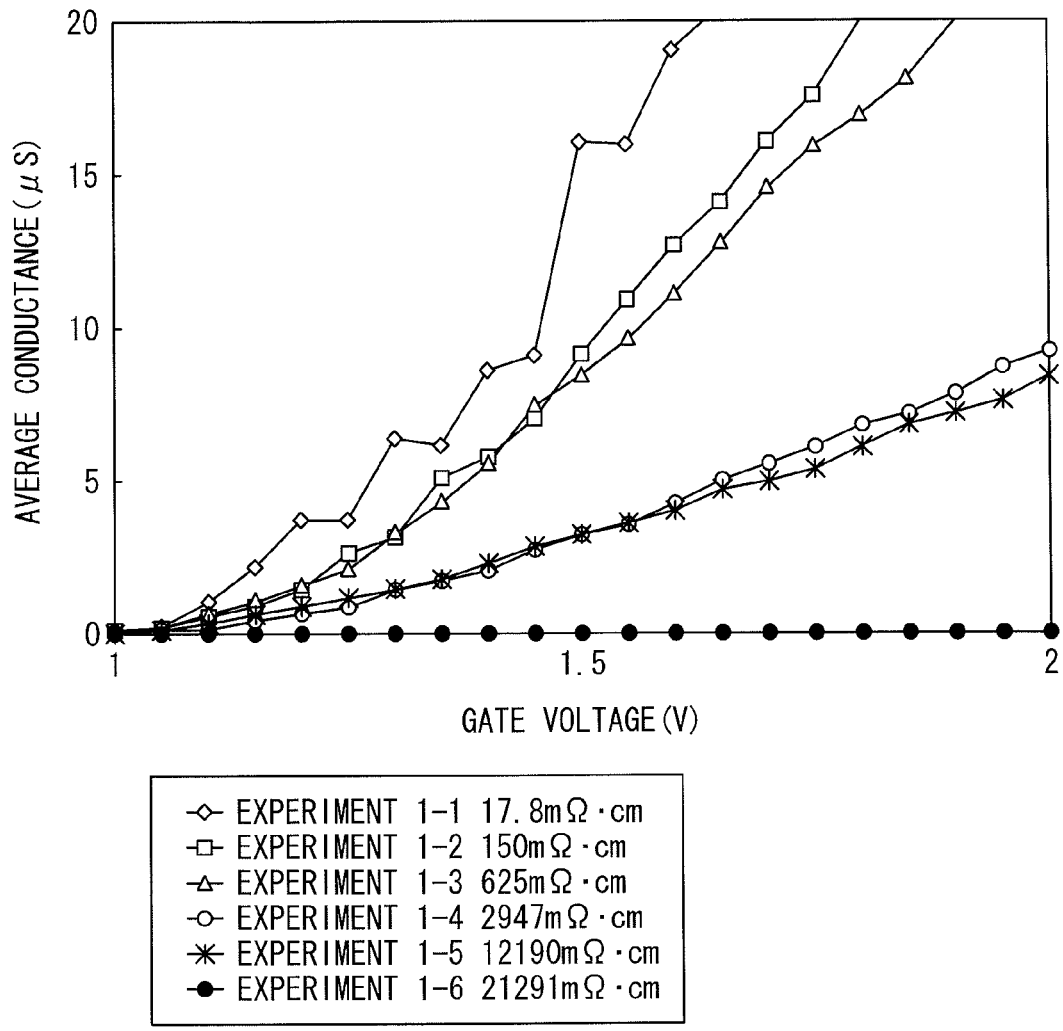
FIG. 7 is a characteristic diagram for comparing writing conductance values in the respective experiments.

It is seen from FIG. 7 that, in each of the Experiments 1-2 to 1-5 in which the volume resistivity was 150 mΩ·cm to 12190 mΩ·cm, the conductance value was gradually increased as the gate voltage was increased. In contrast, in the Experiment 1-1 in which the volume resistivity was 17.8 mΩ·cm, a variation in increase of the conductance value with the increase in gate voltage was great, and some conductance values were reversed. In the Experiment 6 in which the volume resistivity was 21291 mΩ·cm, the conductance value did not vary even when the gate voltage was increased. In other words, it is seen that since a voltage or a current necessary for writing was excessively great, typical drive conditions are not sufficient to perform writing.

As mentioned earlier, as a first condition for achieving the multi-value of a storage unit, it is preferable that the variation in average conductance value of the plurality of storage devices 1 at each writing condition (each gate voltage) be gradual. If the average conductance value steeply varies relative to the gate voltage, then it becomes difficult to finely control, in a narrow range, the conductance values of the plurality of storage device 1 by the gate voltage. Accordingly, it is preferable that the variation in conductance value be gradual relative to the variation in gate voltage. Specifically, it is preferable that the conductance value be gradually increased with the increase in gate voltage without being reversed, as illustrated in the Experiments 1-2 to 1-5. Here, for example, when a range of the gate voltage (Vgw) between which the average conductance values range from 3 μS to 8 μS was defined as ΔVgw, values thereof in the Experiments 1-1 to 1-5 were as illustrated in Table 1. It is to be noted that the Experiment 1-6 was skipped since no variation in conductance value was observed.

TABLE 1

|  | Volume Resistivity (mΩ · cm) | ΔVgw |
|---|---|---|
| Experiment 1-1 | 17.8 | 0.20 |
| Experiment 1-2 | 150 | 0.25 |
| Experiment 1-3 | 625 | 0.25 |

TABLE 1-continued

|  | Volume Resistivity (mΩ · cm) | ΔVgw |
|---|---|---|
| Experiment 1-4 | 2947 | 0.45 |
| Experiment 1-5 | 12190 | 0.55 |

It is seen from Table 1 that ΔVgw was increased as the volume resistivity of the ion source layer 21 was increased. In other words, it can be said that as ΔVgw is increased, it becomes easier to control the conductance values by the gate voltage when writing is performed at the plurality of conductance values in the range from 3 μS to 8 μS. On the contrary, ΔVgw was small in the Experiment 1-1 where the volume resistivity was small, and it can be said that the conductance value is likely to be varied with only a slight difference in gate voltage, that is, it can be said that it is difficult to control the conductance value by the gate voltage, and to achieve the multi-value in a miniaturized storage device that necessitates a control in the narrow range. Given the above, it is seen that when the volume resistivity of the ion source layer is about 150 mΩ·cm to about 12000 mΩ·cm both inclusive, it is possible to control the conductance value at each gate voltage. It is to be noted that the writing current was 30 μA or lower in the Experiments 1-1 to 1-5 in the range in which the conductance value was 8 μS or lower and in which the gate voltage was 1 V to 2 V. That is, it is seen that the multi-value recording by a low current is possible when the volume resistivity of the ion source layer 21 falls within the above-mentioned range.

Figure 8:
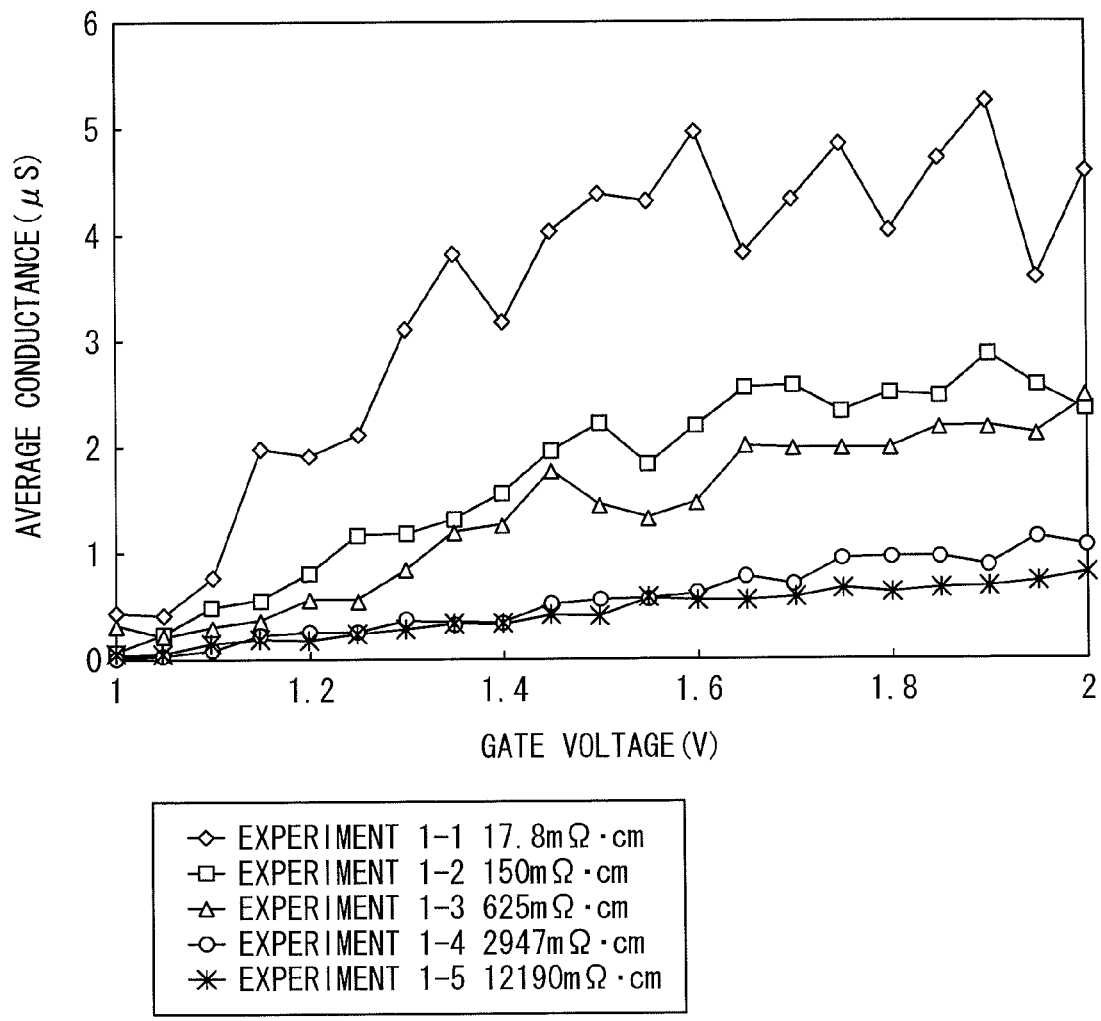
FIG. 8 is a characteristic diagram for comparing standard deviations of the writing conductance values in 30 bits in the respective experiments.

In addition, as a second condition for achieving the above-described multi-value in a storage unit, it is preferable that the conductance values of the plurality of devices under each writing condition (each gate voltage) be uniform, and the variation thereof be small. FIG. 8 shows, in standard deviations, the variations in conductance value in 30 bits relative to the gate voltages in the respective Experiments 1-1 to 1-5. It is to be noted that, similarly to Table 1, the Experiment 6 was skipped since no variation in conductance value was observed. From FIG. 8, it is seen that when compared at the same gate voltage, the greater the volume resistivity in the experiment, the smaller the variation in conductance value therein.

Figure 9:
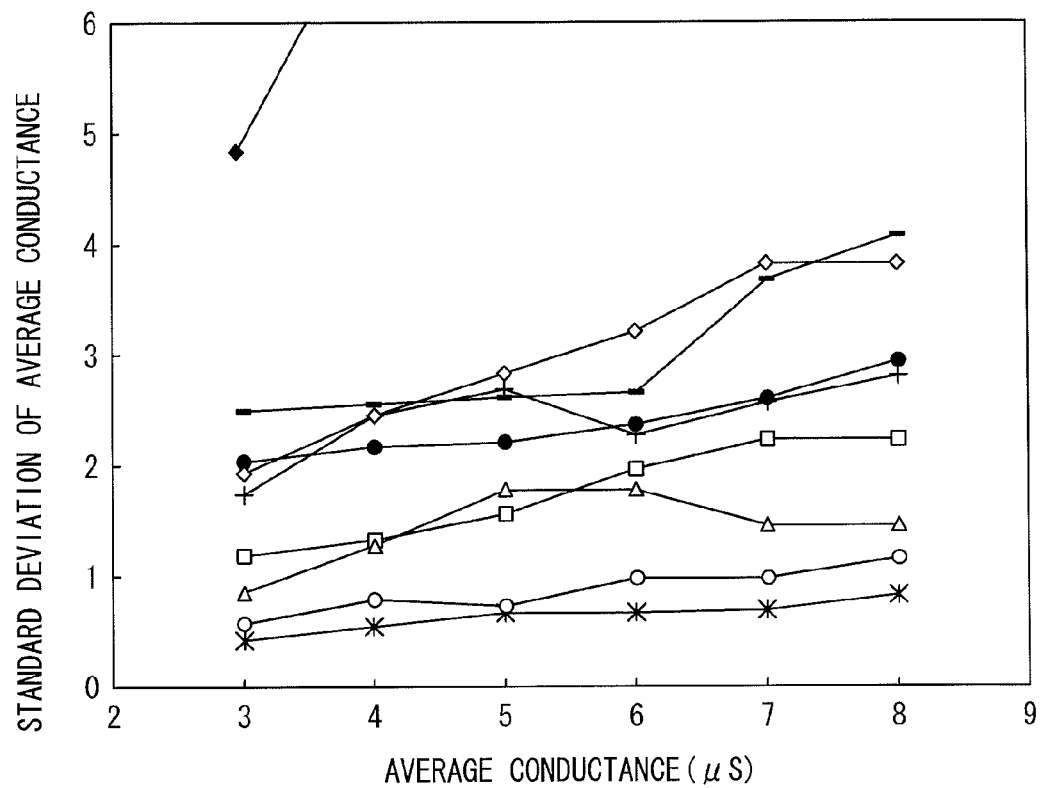
FIG. 9 is a characteristic diagram showing a relationship between the standard deviations of the writing conductances and the average values of the writing conductance values in 30 bits in the respective experiments.

Further, FIG. 9 shows, in standard deviations, the variations in conductance value when, in the respective Experiments 1-1 to 1-5, writing was performed on all of 30 bits by the same gate voltage and the average conductance values of all of the samples were set to the same value. From FIG. 9, it is possible to compare the variation between the storage devices 1 in each of the Experiments 1-1 to 1-5 in the case where the average conductance values were set to the same value in those experiments. It is to be noted that the Experiment 1-6 was skipped for the reason similar to that of Table 1 and FIG. 8. In addition, other than the storage devices 1 of the Experiments 1-1 to 1-5, samples (Experiments 2-1 to 2-5) each including the ion source layer 21 having a configuration of HfTeX—Ox in which Al or Cu was used as X were fabricated, the variation in conductance value of each of which is illustrated in FIG. 9. Compositions of the Experiments 2-1 to 2-5 are illustrated below in the order of "lower electrode/resistance change layer/ion source layer/upper electrode". It is to be noted that manufacturing processes of the Experiments 2-1 to 2-5 were based on those of the above-mentioned Experiments 1-1 to 1-6.

(Experiment 2-1) TiN/Al (2 nm) -Ox/Hf43Te47Al10-Ox (45 nm, 75/5)/W (30 nm); 20.1 mΩ·cm
(Experiment 2-2) TiN/Al (2 nm) -Ox/Hf43Te47Al10-Ox (45 nm, 75/5)/W (30 nm); 610 mΩ·cm (Experiment 2-3) TiN/Al (2 nm) -Ox/Hf53Te39Cu8-Ox (45 nm, 75/7)/W (30 nm); 10 mΩ·cm
(Experiment 2-4) TiN/Al (2 nm) -Ox/Hf42Te45Cu13-Ox (45 nm, 75/5)/W (30 nm); 500 mΩ·cm It is seen from FIG. 9 that even when the average writing conductance values in 30 bits were the same value in the Experiments 1-1 to 1-5, the greater the volume resistivity of the ion source layer 21, the smaller the variation in writing conductance value in each of the storage devices 1. In particular, in the low conductance region of 3 μS to 8 μS, the standard deviation of the writing conductance value of the storage devices 1 in the Experiment 1-1 was greater than those of the storage devices 1 in the Experiments 1-2 to 1-5. That is, it can be said that the storage devices 1 of the Experiment 1-1 cause great variation and are unsuitable for the multi-value recording. In addition, the standard deviation of the writing conductance value in each of the Experiments 2-1 to 2-4 where Al or Cu was added to the ion source layer was greater than those of the Experiments 1-2 to 1-5 even when the volume resistivity is 150 mΩ·cm or more. That is, it is seen that when Al or Cu is added to the ion source layer 21, the variation in writing conductance value tends to be increased.

From the above results, it is seen that, in a resistance-change type storage device, it is possible to improve the controllability of the writing conductance value and to suppress the variation in conductance value between the plurality of devices by setting the volume resistivity of the ion source layer 21 to fall in the range from about 150 mΩ·cm to about 12000 mΩ·cm both inclusive. That is, by setting the volume resistivity of the ion source layer 21 to fall in the range from about 150 mΩ·cm to about 12000 mΩ·cm both inclusive, it is possible to provide the storage unit that allows the multi-value recording. Incidentally, from the results of the Experiments 2-1 to 2-4 illustrated in FIG. 9, it is seen that the storage device more suitable for the multi-value recording may be achieved when Al and Cu are not used as the materials of the ion source layer 21. In addition, while only the experiments where the resistance change layer is made of Al—Ox are illustrated here, a similar effect is obtained even in the case where the resistance change layer of the storage device 1 of the present embodiment is configured of an oxide film, a nitride film, or an oxynitride film of Zr, Hf, Y, or the like.

Hereinabove, while the present disclosure has been described with reference to the example embodiment and the working example, the present disclosure is not limited to the above-mentioned embodiment and so forth, and various modifications may be made.

For example, while, in the above-mentioned embodiment and working example, the configurations of the storage device 1 and the memory cell array 2 are described in detail, all of the layers are not necessarily be included, and other layers may be further included. In addition, the materials of the layers, the method of forming the films, and the film formation conditions described in the above-mentioned embodiment and so forth are not limitative, and other materials and other methods of forming the films may also be adopted. For example, an additive element may be used in the ion source layer 21 to the extent that the above-mentioned composition ratio, demand characteristics for the multi-value memory, or the like is not impaired.

Further, the storage device 1 according to any of the above-mentioned embodiment and so forth may have a structure in which the positions of the ion source layer 21 and the resistance change layer 22 are reversed upside down. Also, a cross point structure or system may be employed in which an appropriate diode is used in combination in order to increase memory capacity. Further, the memory device may also be laminated in a vertical direction. In this manner, the storage device 1 according to any of the above-mentioned embodiment and so forth is applicable to various memory structures.

Furthermore, the technology encompasses any possible combination of some or all of the various embodiments described herein and incorporated herein.

It is possible to achieve at least the following configurations from the above-described example embodiments of the disclosure.

(1) A storage device, including:
 a first electrode;
 a storage layer including an ion source layer; and
 a second electrode,
 the first electrode, the storage layer, and the second electrode being provided in this order,
 wherein the ion source layer contains a movable element, and has a volume resistivity of about 150 mΩ·cm to about 12000 mΩ·cm both inclusive.
(2) The storage device according to (1), wherein the ion source layer has the volume resistivity of about 450 mΩ·cm to about 3000 mΩ·cm both inclusive.
(3) The storage device according to (1) or (2), wherein the movable element is positively or negatively ionized by application of an electric field.
(4) The storage device according to (3), wherein the ion source layer contains, as the movable element positively ionized, one or more elements selected from a group consisting of Group 3 elements, Group 4 elements, and Group 5 elements of the Periodic Table.
(5) The storage device according to (4), wherein the movable element positively ionized is one of titanium (Ti), zirconium (Zr), and hafnium (Hf).
(6) The storage device according to (3), wherein the ion source layer contains, as the movable element negatively ionized, one or more elements selected from Group 16 elements of the Periodic Table.
(7) The storage device according to (6), wherein the movable element negatively ionized is one of sulfur (S), selenium (Se), and tellurium (Te).
(8) The storage device according to any one of (1) to (7), wherein the ion source layer is free from aluminum (Al) and copper (Cu).
(9) The storage device according to any one of (1) to (8), wherein the storage layer includes a resistance change layer provided closer to the first electrode than the second electrode.
(10) The storage device according to (9), wherein the resistance change layer is configured of one of a metal oxide film, a metal nitride film, and a metal oxynitride film.
(11) The storage device according to any one of (1) to (10), wherein the resistance change layer has a resistance value that varies in response to formation of a low-resistance section, the low-resistance section being formed in the resistance change layer by containing the movable element or an oxygen defect upon application of a voltage to the first electrode and the second electrode.
(12) A storage unit provided with a plurality of storage devices and a pulse applier that selectively applies one of a voltage pulse and a current pulse to the storage devices, the storage devices each including:
 a first electrode;
 a storage layer including an ion source layer; and
 a second electrode,
 the first electrode, the storage layer, and the second electrode being provided in this order, wherein the ion source layer contains a movable element, and has a volume resistivity of about 150 mΩ·cm to about 12000 mΩ·cm both inclusive.

The present disclosure contains subject matter related to that disclosed in Japanese Priority Patent Application JP 2012-137588 filed in the Japan Patent Office on Jun. 19, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A storage device, comprising:
a first electrode;
a second electrode; and
a storage layer between the first and second electrodes, the storage layer including an ion source layer,
wherein,
the ion source layer contains neither aluminum (Al) nor copper (Cu),
the ion source layer contains a movable element,
the ion source layer contains oxygen, and
the ion source layer has a volume resistivity of at least 150 mΩ·cm but less than or equal to 12000 mΩ·cm such that the storage layer has a low resistance state corresponding to first stored information, a high resistance state corresponding to second stored information, and at least one intermediate resistance state, between the low resistance state and the high resistance state, corresponding to third stored information.

2. The storage device according to claim 1, wherein the ion source layer has the volume resistivity of about 450 mΩ·cm to about 3000 mΩ·cm both inclusive.

3. The storage device according to claim 1, wherein the movable element is positively or negatively ionized by application of an electric field.

4. The storage device according to claim 3, wherein the ion source layer contains, as the movable element positively ionized, one or more elements selected from the group consisting of Group 4 elements, Group 5 elements, and Group 6 elements of the Periodic Table.

5. The storage device according to claim 4, wherein the movable element is selected from the group consisting of titanium (Ti), zirconium (Zr), and hafnium (Hf).

6. The storage device according to claim 3, wherein the ion source layer contains, as the movable element negatively ionized, one or more elements selected from the group consisting of Group 16 elements of the Periodic Table.

7. The storage device according to claim 6, wherein the movable element negatively ionized is selected from the group consisting of sulfur (S), selenium (Se), and tellurium (Te).

8. The storage device according to claim 1, wherein the storage layer includes a resistance change layer provided closer to the first electrode than the second electrode.

9. The storage device according to claim 8, wherein the resistance change layer is configured from a metal oxide film, a metal nitride film, or a metal oxynitride film.

10. The storage device according to claim 8, wherein the resistance change layer has a resistance value that varies in response to an application of a voltage to the first electrode and the second electrode.

11. A storage unit with a plurality of storage devices and a pulse applier that selectively applies a voltage pulse or a current pulse to the storage devices, the storage devices each comprising:
a first electrode;
a second electrode; and
a storage layer between the first and second electrodes, the storage layer including an ion source layer
wherein,
the ion source layer contains neither aluminum (Al) nor copper (Cu),
the ion source layer contains a movable element,
the ion source layer contains oxygen, and
the ion source layer has a volume resistivity of at least 150 mΩ·cm but less than or equal to 12000 mΩ·cm such that the storage layer has a low resistance state corresponding to first stored information, a high resistance state corresponding to second stored information, and at least one intermediate resistance state, between the low resistance state and the high resistance state, corresponding to third stored information.

12. A storage device, comprising:
a first electrode;
a second electrode; and
a storage layer between the first and second electrodes, the storage layer including a resistance change layer and an ion source layer,
wherein,
the resistance change layer has a resistance value that varies in response to an application of a voltage to the first electrode and the second electrode,
the resistance change layer is selected from the group consisting of a metal oxide film, a metal nitride film, and a metal oxynitride film,
the ion source layer includes a metal chalcogenide oxide layer comprised of a transition metal element, a chalcogen element and oxygen,
the metal chalcogenide oxide layer has an amorphous structure,
the transition metal element is selected from the group consisting of titanium (Ti), zirconium (Zr), hafnium (Hf), vanadium (V), niobium (Nb), tantalum (Ta), chromium (Cr), molybdenum (Mo), and tungsten (W),
the chalcogen element is selected from the group consisting of tellurium (Te), sulfur (S), and selenium (Se),
the ion source layer contains neither aluminum (Al) nor copper (Cu),
the ion source layer does not contain any movable element that is as movable or more movable in the metal chalcogenide oxide layer upon application of the voltage than either aluminum or copper, and
the ion source layer has a volume resistivity of at least 150 mΩ·cm but less than or equal to 12000 mΩ·cm such that the storage layer has a low resistance state corresponding to first stored information, a high resistance state corresponding to second stored information, and at least one intermediate resistance state, between the low resistance state and the high resistance state, corresponding to third stored information.

13. The storage device of claim 12, wherein:
the ion source layer has a film thickness of 10 nm to 15 nm, both inclusive, and
the ion source layer has a volume resistivity of 450 mΩ·cm to 3000 mΩ·cm, both inclusive.

* * * * *